(12) United States Patent
Addinall et al.

(10) Patent No.: US 6,972,494 B1
(45) Date of Patent: Dec. 6, 2005

(54) INTEGRATED CIRCUIT DIE FOR WIRE BONDING AND FLIP-CHIP MOUNTING

(75) Inventors: Ross Addinall, Tadley (GB); Gareth Rhys Davies, East Garston (GB)

(73) Assignee: Agere Systems Inc., Allentown, PA (US)

( * ) Notice: Subject to any disclaimer, the term of this patent is extended or adjusted under 35 U.S.C. 154(b) by 680 days.

(21) Appl. No.: 09/639,288

(22) Filed: Aug. 15, 2000

(30) Foreign Application Priority Data

Aug. 17, 1999  (EP) .................................. 99306444
Dec. 7, 1999  (EP) .................................. 99309842

(51) Int. Cl.[7] ...................... H01L 23/48; H01L 23/52; H01L 29/40
(52) U.S. Cl. ...................... 257/778; 257/780
(58) Field of Search ............... 257/700, 778, 257/780

(56) References Cited

U.S. PATENT DOCUMENTS

| | | | | |
|---|---|---|---|---|
| 5,155,065 A | | 10/1992 | Schweiss | 437/209 |
| 5,381,307 A | * | 1/1995 | Hertz | 361/767 |
| 5,641,946 A | * | 6/1997 | Shim | 257/738 |
| 5,757,082 A | | 5/1998 | Shibata | 257/786 |
| 5,801,450 A | | 9/1998 | Barrow | 257/784 |
| 6,175,157 B1 | * | 1/2001 | Morifuji | 257/777 |
| 6,265,783 B1 | * | 7/2001 | Juso et al. | 257/786 |

FOREIGN PATENT DOCUMENTS

| | | | | |
|---|---|---|---|---|
| EP | 0 481 889 A1 | 10/1991 | ......... | H01L 23/485 |
| EP | 0 588 481 A1 | 8/1993 | ......... | H01L 23/495 |

OTHER PUBLICATIONS

European Search Report, dated Nov. 24, 1999.

* cited by examiner

Primary Examiner—Phat X. Cao

(57) ABSTRACT

An integrated circuit die carries conductive pads and thereon, the larger pads being suitable for flip-chip assembly and the smaller pads being suitable for wire bond assembly. The pitch between pads is at least the minimum required for flip-chip assembly, whereas the pitch between each of pads and the adjacent pad or pads is at least the minimum required for wire bond assembly. For wire bond assembly a passivation layer exposing all pads is provided, whereas for flip-chip assembly a passivation layer exposes only certain pads so that conductive bumps may be provided. The provision of pads complying with the minimum spacing requirements for both flip-chip and wire bond assembly enables a "dual purpose" (e.g. one set of pads being for normal production and another set for testing purposes) die to be produced without any increase in die size.

7 Claims, 2 Drawing Sheets

INTEGRATED CIRCUIT DIE FOR WIRE BONDING AND FLIP-CHIP MOUNTING

CROSS-REFERENCE TO RELATED APPLICATION

This application claims priority of European Patent Application No. 99306444.3, which was filed on Aug. 17, 1999 and European Patent Application No. 99309842.5 which was filed on Dec. 7, 1999.

FIELD OF THE INVENTION

This invention relates to integrated circuit dies.

BACKGROUND OF THE INVENTION

When an integrated circuit design nears the production stage it is usual to produce a prototype version having additional conductive pads to which connection may be made for testing and de-bugging purposes. Where conventional wire bonding is used to make connections to the pads on the integrated circuit die, it is common practice to provide a plurality of conductive pads to all of which wire bond connections may be made for testing and de-bugging purposes and to a subset of which wire bond connections may be made in final production. However in the case of an integrated circuit die which will be assembled as a so-called flip-chip it is necessary for the center-to-center pitch, or spacing, between the conductive pads to be much larger than is necessary where wire bonding is used to make the connections. This much larger pitch renders it impractical to adopt the same idea as in the wire bonding case, that is having additional pads for testing and de-bugging, because the integrated circuit die would be so large that it would be uneconomic.

SUMMARY OF THE INVENTION

According to this invention an integrated circuit die includes first and second sets of conductive pads for enabling external connections to be made to the integrated circuit, there being at least a first predetermined center-to-center spacing between each pad of the first set and the adjacent pad or pads of the first set, and at least a second predetermined center-to-center spacing, less than said first spacing, between each pad of the second set and the adjacent pad or pads of the first and second sets, and a passivation layer exposing only pads of the first set, or exposing pads of the first and second sets.

The pads of the first set may be larger in area than the pads of the second set. The area of each pad of the first set and the first predetermined center-to-center spacing may be suitable for flip-chip assembly of the die, and the area of each pad of the second set and the second predetermined center-to-center spacing may be suitable for wire bond assembly of the die.

The pads of the first and second sets may be disposed in-line adjacent one or more edges of the die.

The pads of the first set may be disposed in two lines adjacent one or more edges of the die, the pads of the first set in one of the two lines being disposed in staggered relationship with respect to the pads of the first set in the other of the two lines. The pads of the second set may be disposed in one of the two lines.

The first set of pads may be connected to one set of connection points in the integrated circuit, and the second set of pads may be connected to another set of connection points in the integrated circuit.

BRIEF DESCRIPTION OF THE DRAWINGS

The invention will now be described by way of example with reference to the accompanying drawings, in which.

In the various figures, which are not to scale, like references denote like parts.

DETAILED DESCRIPTION

Figure 1:
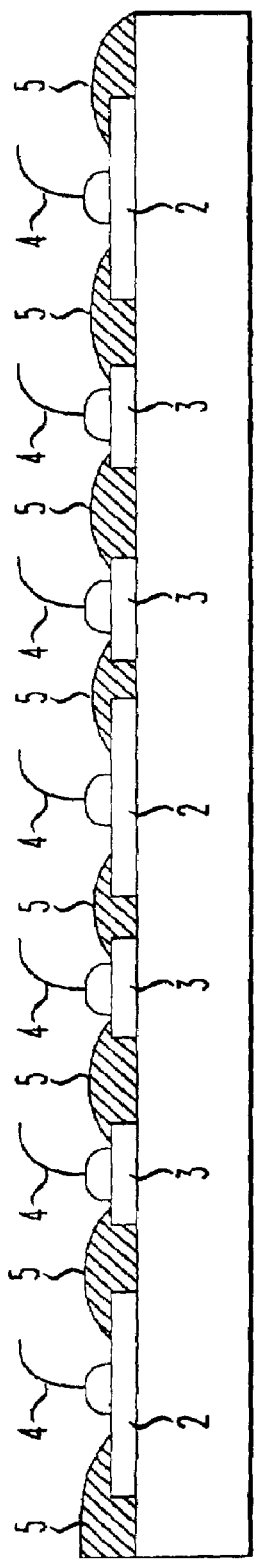
FIG. 1 is a schematic cross section of part of an integrated circuit die embodying the invention.

Referring now to FIG. 1, an integrated circuit die comprises polysilicon and metal layers shown schematically at 1 and making up the circuitry (not shown) embodied in the integrated circuit. Deposited on the surface of 1 is a first set of conductive pads 2 and a second set of conductive pads 3. The sets of conductive pads 2 and 3 are provided for the purpose of enabling connection to be made between the circuitry embedded in the integrated circuit and external terminals (not shown). The first set of pads 2, which are considerably larger than the second set of pads 3, are provided for flip-chip assembly as will be described later, and are connected (by means not shown) to one set of connection points in the circuitry. The second set of pads 3 are provided to enable wire bond connections to be made to the integrated circuit e.g. for testing and de-bugging purposes, and are connected (by means not shown) to another set of connection points in the circuitry. Wire bond connections may also be made to the first set of pads 2, and, as shown, all of the pads 2 and 3 have a wire bond connection 4 thereto. A passivation layer 5 of conventional passivating material is provided over the surface of the integrated circuit die leaving an area uncovered on each of the pads 2 and 3 for the wire bond connections 4 thereto. The pitch, or center-to-centre spacing, between each pad 2 of the first set and the adjacent pad or pads 2 of the first set is at least a predetermined amount required for flip-chip assembly. Currently this pitch is 200 microns or 250 microns depending on the manufacturer. A smaller pitch than that required will result in manufacturing problems and a significant rejection rate. The minimum pitch for connection by wire bonding is much less and is currently 90 microns, although with present wire bonding technology the pitch could be as low as 50 microns. Thus the center to center spacing, or pitch, between each pad 3 of the second set of pads and the adjacent pad or pads, whether it be a pad 2 of the first set of pads or a pad 3 of the second set of pads, must be at least equal to the lower spacing requirements imposed by wire bonding.

Figure 2:
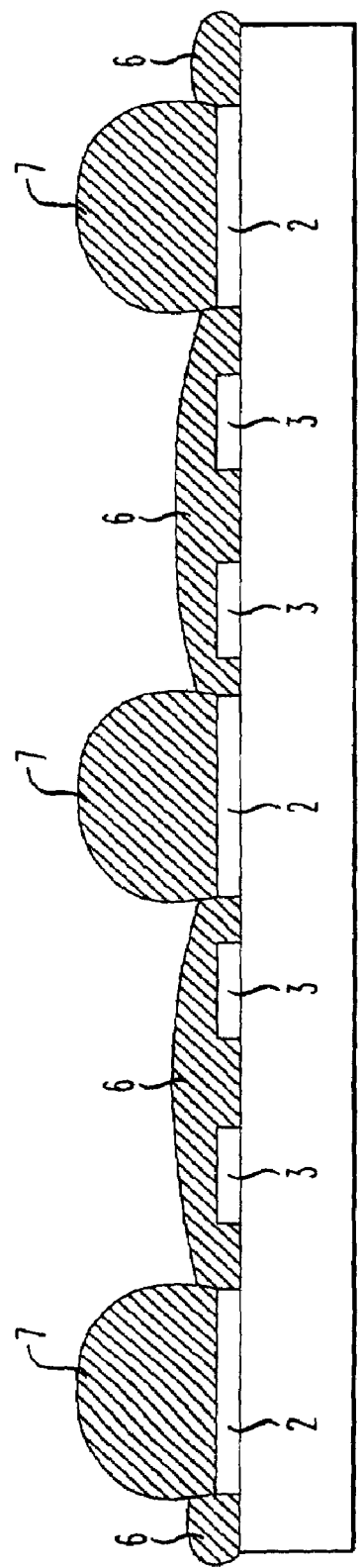
FIG. 2 is a schematic cross section of part of an integrated circuit die embodying the invention.

FIG. 2 shows the same basic integrated circuit die shown in FIG. 1 but, instead of the passivating layer 5 of FIG. 1 exposing the conductive pads for wire bond connections thereto, FIG. 2 shows the integrated circuit die prepared for flip-chip assembly. To this end, a passivating layer 6 is provided over the surface of the die exposing only the pads 2 of the first set of pads which, as previously noted with reference to FIG. 1, are of a size suitable for flip-chip assembly. It will be noted that passivating layer 6 exposes an area of pads 2 which is greater than for the wire bond assembly case shown in FIG. 1. Each of the pads 2 has deposited thereon a "bump" of conductive material, such as gold or solder, which by the application of heat is caused to re-flow and effect connection between its respective pad 2 and an external terminal (not shown). The mechanics of flip-chip assembly are well known and will not be described further. Because passivating material 6 covers the conductive pads 3 of the second set, the necessary minimum pitch imposed by flip-chip assembly between each conductive pad 2 and the pad or pads adjacent thereto is ensured. If the pads 3 of the second set of pads were not covered by passivating material 6 the minimum pitch requirements for flip-chip assembly would not be met, and problems during such assembly would be likely with a significant rejection rate of assembled dies.

It will be appreciated that an integrated circuit die embodying the invention may simultaneously comply with the minimum pitch requirements for both flip-chip assembly and wire bonding without any, or any significant, increase in the size of the die. Thus the same die may be used in a flip-chip assembly process or a conventional wire bonding assembly process merely by changing a single mask layer namely, the passivation layer.

Figure 3:
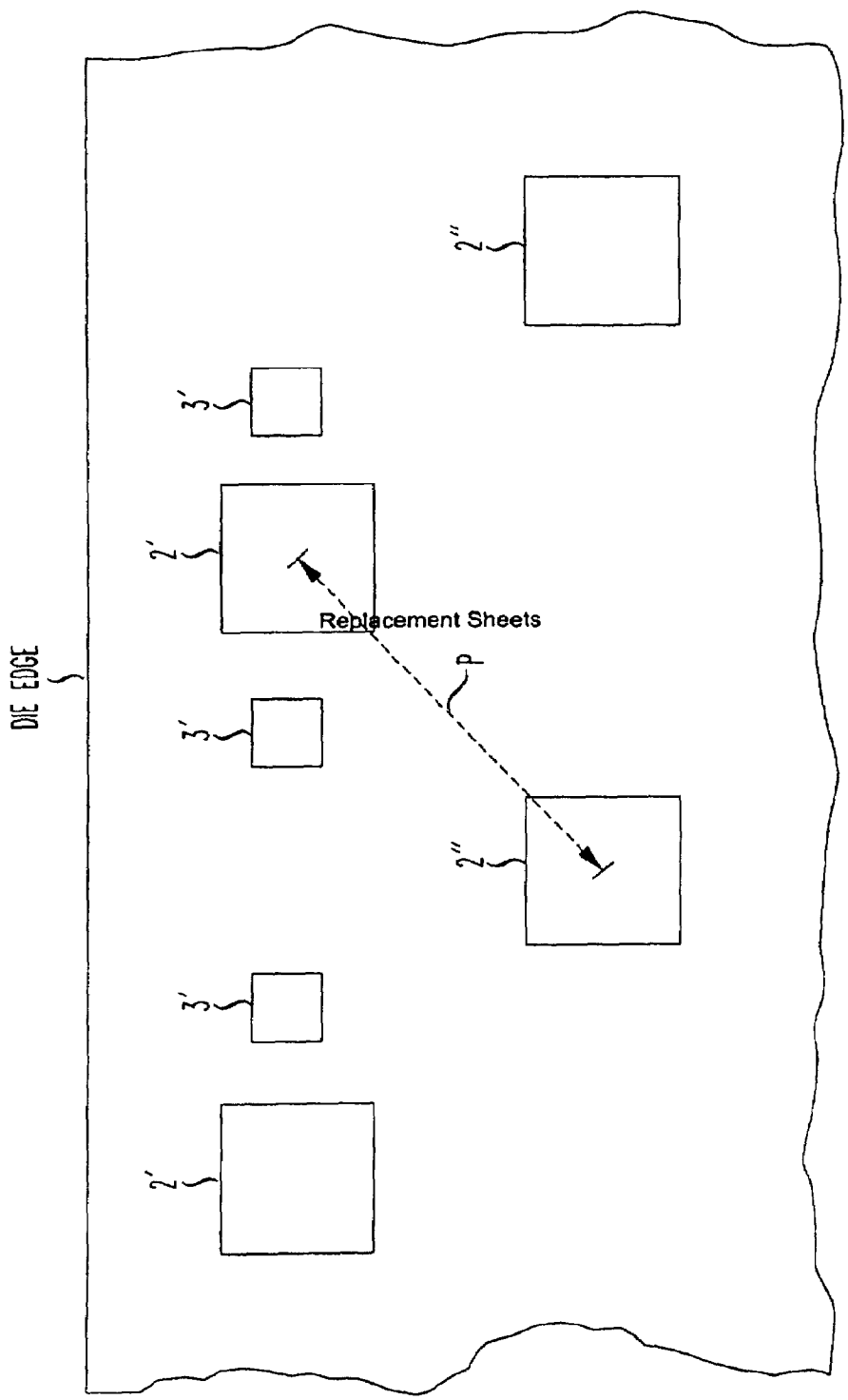
FIG. 3 is a schematic plan view of part of an integrated circuit die embodying the invention.

The invention is not limited in its application to in-line pads. For example, two rows of pads may be provided as long as the minimum pitch requirements for flip-chip assembly and wire bonding are satisfied. FIG. 3 shows in schematic plan view part of an integrated circuit die having two rows of pads. As in FIGS. 1 and 2, two sets of pads are shown, the first set comprising pads 2' and 2", and the second set comprising pads 3'. The pads 2' and 3' are arranged in a row or line adjacent to the die edge shown in FIG. 3. The pads 2" are arranged in another row or line parallel with the die edge but further therefrom. The pads 2" may be, and as shown are, staggered in relation to the other pads 2' of the first set of pads. The pads of the first set, pads 2' and pads 2", are larger than the pads 3' of the second set of pads and, as in FIGS. 1 and 2, the larger pads may be used for flip-chip or wire bonding assembly, whereas the smaller pads 3' are intended for wire bonding assembly. As before, each of pads 2' and 2" are pitched apart by at least the minimum required distance for flip-chip assembly, the distance being indicated schematically for two of the staggered pads by the dashed-arrowed line P. Each of the pads 3' of the second set of pads is spaced apart from the adjacent pad or pads, whether of the first or second sets of pads, by at least the minimum spacing required for wire bonding assembly. Staggering of the pads 2' and 2" has the advantage that the periphery of the die may be reduced and, where these pads are used for wire bond assembly, it also has the advantage that their effective pitch, i.e. the pitch as measured along the die edge, matches more closely the pitch of the lead frame of an intended package.

It will be appreciated that the spacing between the pads in FIGS. 1, 2 and 3 need not be uniform or symmetrical; what is required is that the spacing between each pad and the adjacent pad or pads be at least the required minimum spacing for flip-chip or wire bond assembly as the case may be.

The invention permits the same basic integrated circuit die to be used for flip-chip production, and a higher pin count version to be produced for wire bonding. Such a "dual purpose" die may be produced without an increase in die size. In effect the invention permits two separate integrated circuit dies to be produced at a minimum extra cost. Furthermore, the delay characteristics of the input/output paths and the internal parasitic characteristics of the die are substantially the same for both flip-chip and wire bonding assembly options. As will be appreciated, the invention permits the decision as to whether to use flip-chip or wire bonding assembly to be made at a later stage in the production cycle.

What is claimed is:

1. An integrated circuit die including first and second sets of conductive pads for enabling external connections to be made to the integrated circuit, there being at least a first predetermined center-to-center spacing between each pad of the first set and the adjacent pad or pads of the first set, and at least a second predetermined center-to-center spacing, less than said first spacing, between each pad of the second set and the adjacent pad or pads of the first and second sets, wherein the pads of the first set are disposed in two lines adjacent one or more edges of the die, the pads of the first set in one of the two lines being disposed in staggered relationship with respect to the pads of the first set in the other of the two lines, and a passivation layer exposing only pads of the first set, or exposing pads of the first and second sets.

2. A die as claimed in claim 1 wherein the pads of the second set are disposed in one of the two lines.

3. A die as claimed in claim 1 wherein the pads of the first set are larger in area than the pads of the second set.

4. A die as claimed in claim 3 wherein the area of each pad of the first set and the first predetermined center-to-center spacing are suitable for flip-chip assembly of the die, and the area of each pad of the second set and the second predetermined center-to-center spacing are suitable for wire bond assembly of the die.

5. A die as claimed in claim 1 wherein the pads of the second set are disposed in line adjacent one or more edges of the die.

6. A die as claimed in claim 1 wherein the pads of the second set are disposed in one of the two lines.

7. A die as claimed in any preceding claim wherein the first set of pads is connected to one set of connection points in the integrated circuit, and the second set of pads is connected to another set of connection points in the integrated circuit.

* * * * *